United States Patent [19]

Miyashita

[11] Patent Number: 5,361,189
[45] Date of Patent: Nov. 1, 1994

[54] EXTERNAL LEAD TERMINAL ADAPTOR AND SEMICONDUCTOR DEVICE

[75] Inventor: Shuji Miyashita, Kanagawa, Japan

[73] Assignee: Fuji Electric Co., Ltd., Kanagawa, Japan

[21] Appl. No.: 970,373

[22] Filed: Nov. 2, 1992

[30] Foreign Application Priority Data

Nov. 13, 1991 [JP] Japan .................... 3-296975

[51] Int. Cl.⁵ .............................................. H05K 7/02
[52] U.S. Cl. .................................... 361/807; 361/823; 439/908
[58] Field of Search ............... 200/307; 361/729, 735, 361/748, 784, 790, 822, 807, 823, 828; 439/709, 712, 713, 723, 724, 908

[56] References Cited

U.S. PATENT DOCUMENTS

| | | | |
|---|---|---|---|
| 304,593 | 9/1884 | Baker | 361/828 |
| 4,600,968 | 7/1986 | Sekiya et al. | 361/735 |
| 5,038,197 | 8/1991 | Satriano | 257/678 |

FOREIGN PATENT DOCUMENTS

| | | |
|---|---|---|
| 0145256 | 6/1985 | European Pat. Off. . |
| 2300137 | 7/1974 | Germany ........... 361/823 |

OTHER PUBLICATIONS

"300 Ampere, 1000 Volt Hermetic Darlington Transistor," M. Morozowich, 1 Oct. 1989, Conf. Record of the 1989 IEEE IAS Annual Meeting, IEEE Catalog No. 89CH2792-0, San Diego, US pp. 1352–1355.

*Primary Examiner*—Leo P. Picard
*Assistant Examiner*—Donald A. Sparks
*Attorney, Agent, or Firm*—Finnegan, Henderson, Farabow, Garrett & Dunner

[57] ABSTRACT

A semiconductor device 1 having external lead terminals 14 and 15 on an upper level surface portion 12 and a lower level surface portion 13 formed in a top cover 11 of a resin package so as to produce a level difference between them in combination with an external lead terminal adaptor 2 having terminal conductors 22 on a terminal block body 21 adapted to be stacked on the lower level surface portion so that the level difference between the higher and lower level portions is compensated, and the terminal conductors of the adaptor are connected with the external lead terminals disposed on the lower level portion of the semiconductor device. This enables the terminal conductors and external lead terminals to have the same level or to be aligned in the same plane, so that external wiring between the semiconductor device and the printed circuit board mounted thereon can be easily accomplished.

2 Claims, 1 Drawing Sheet

EXTERNAL LEAD TERMINAL ADAPTOR AND SEMICONDUCTOR DEVICE

BACKGROUND OF THE INVENTION

1. Field of the Invention

This invention relates to an external lead terminal adaptor for a semiconductor device, such as a power transistor module, and to a semiconductor device in which such an adaptor is used.

2. Description of the Related Art

In a power transistor module, such components as a transistor chip, external lead terminals connected to the transistor chip, and the like are incorporated in a sealed resin package in a manner so that the tips of the external lead terminals are presented on the upper face of a cover for the package. In order to obtain as much creepage insulation distance as possible between the terminals, generally, such a power transistor module is constructed so that the top of the package cover is stepped to provide vertically spaced upper and lower surface portions with the tips of external lead terminals arranged on both surface portions.

When a power transistor module of this type is used to provide an electronic device, such as an inverter, in order to reduce the size of the device, a printed circuit board, on which a snubber circuit and a driver, for example, are mounted, is commonly screwed directly to the upper face of the transistor module. The circuits on the printed circuit board are then electrically connected with the external lead terminals of the transistor module. However, because the external lead terminals of the power transistor module are not located in the same plane, but in planes at different levels, the external wiring between the printed circuit board and the transistor module require provision of wiring bars which are bent in accordance with the levels of the terminals, for example, thereby increasing manufacturing costs. This requirement may be avoided with an improved configuration wherein the cover for the transistor module package is made flat so that all external lead terminals are arranged in the same plane. However, this design gives rise to other problems such as redesign of the package and cover, the insulating characteristics thereof, requires additional costs, and hence is not advantageous.

SUMMARY OF THE INVENTION

The present invention has been made in view of the above circumstances and has as an object to provide an external lead terminal adaptor which, when combined with a printed circuit board, allows a semiconductor device, such as the above-mentioned power transistor module, to be combined without changing the external shape thereof, with a printed circuit board in an electronic device, such as an inverter, so that external wiring connections between the device and the board are easily accomplished.

A further object of the present invention is to provide a semiconductor device in which such an adaptor is easily used.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims To achieve the objects and in accordance with the purpose of the invention, as embodied and broadly described herein, the external adaptor for a semiconductor, of this invention comprises a block body made of a resin, and one or more terminal conductors which are integrally embedded in and extend through the block body, the terminal conductors having a connecting section at each end and located on the respective end faces of said block body.

For the sake of simplifying the connection between the adaptor and a semiconductor device to be connected, the block body may have one or more screw insertion holes, the positions of said screw insertion holes respectively corresponding to the positions of the connecting sections disposed on the lower end face of the block body, the screw insertion holes extending from the upper end face of the block body to the corresponding connecting section.

Furthermore, according to the invention, in a semiconductor device comprising a package and a top cover for said package, said cover having a step portion to define an upper level surface portion and a lower level surface portion, one or more external lead terminals from the inside of said package being located on each of said upper and lower level portions, the above-mentioned external lead terminal adaptor is stacked on said lower level portion to compensate for the level difference between the upper and lower surface portions, and the connecting sections on the lower end face of said block body are electrically connected with the external lead terminals located on said lower level portion.

When a printed circuit board is directly mounted on a semiconductor device, such as a power transistor module or the like to provide an electronic device, the external lead terminal adaptor, previously prepared as an optional part so as to conform to the outer shape of the package of the semiconductor device, is attached to the lower level surface portion, and the terminal conductors of the adaptor are electrically connected with the external lead terminals located on the lower surface portion, so that the terminal conductors of the adaptor are aligned in the same plane as that of the external lead terminals located on the higher level surface portion. Therefore, external wiring required for electrical connections between the semiconductor device and the printed circuit board mounted thereon can be easily accomplished.

BRIEF DESCRIPTION OF THE DRAWINGS

The accompanying drawings, which are incorporated in and constitute a part of this specification, illustrate embodiments of the invention and, together with the description, serve to explain the objects, advantages and principles of the invention. In the drawings.

DESCRIPTION OF THE PREFERRED EMBODIMENTS

Figure 1:
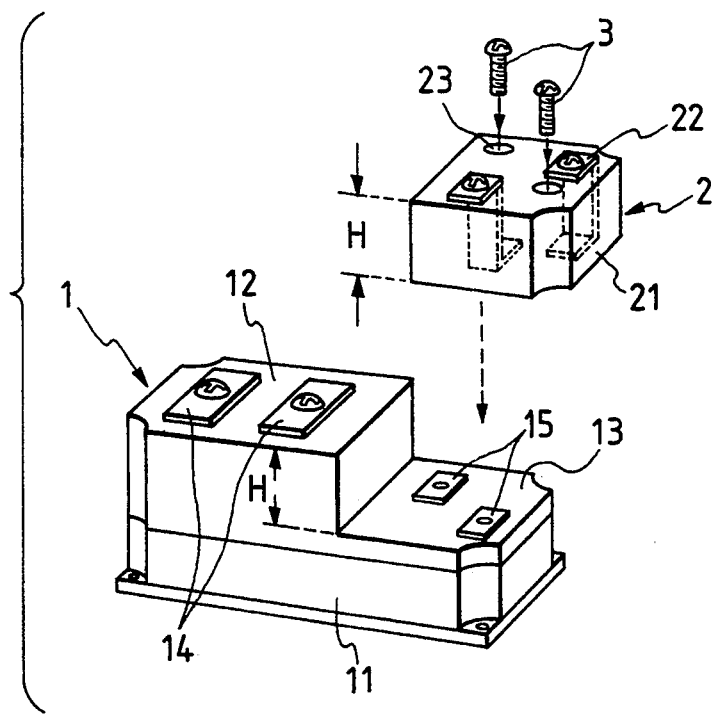
FIG. 1 is an exploded perspective view showing an embodiment of an external lead terminal adaptor and a semiconductor device to be combined with the adaptor in accordance with the invention.

In the accompanying drawing figures, reference numerals 1 and 2 designate, respectively, a power transistor module and an external lead terminal adapter in exemplary embodiments of the invention. In one such embodiment shown in FIGS. 1, 2 and 3(a), a top cover 11 of a resin case package of the power transistor module 1 has an upper level surface portion 12 and a lower level surface portion 13. A level difference or step H exists between the upper and lower surface portions. On the upper and lower surface portions 12 and 13, respectively arranged are external lead terminals, 14 and 15 which extend from the inside of the package.

The external lead terminal adaptor 2 includes a resin block body 21, and terminal conductors 22 which extend through the resin block body 21 in a vertical direction and are integrally molded therein. The resin block body 21 is designed so that its outer dimensions conform to the plan contour of the lower level surface portion 13 and also to the level difference H between the upper and lower surface portions 12 and 13 of the power transistor module 1. The terminal conductors 22, which are embedded in the block body 21, have a reversely bent shape in which connecting sections 22a and 22b at the respective upper and lower ends of each of the terminal conductors are bent to extend in directions opposite to each other and form an erect Z-shape configuration. The connecting sections 22a and 22b are disposed on the upper and lower faces of the resin block body 21, respectively. A tapped hole is formed in each of the connecting sections 22a and 22b. Moreover, screw insertion holes 23 are formed in the resin block body 21 so as to correspond with the positions of the respective connecting sections 22b and open on the upper face of the resin block body 21.

When the external lead terminal adaptor 2 is combined with the power transistor module 1, the adaptor 2 is stacked on the lower level portion 13 of the package 11 as illustrated. In this state, screws 3 are inserted downward into the screw insertion holes 23, and then the connecting sections 22b of the terminal conductors 22 disposed on the lower face of the adaptor 2 are fastened by the screws 3 to the external lead terminals 15 of the module. In this manner, the adaptor 2 is mechanically coupled to the module 1 and the terminal conductors 22 are electrically connected to the external lead terminals 15.

When the external lead terminal adaptor 2 is attached to the power transistor module 1 in the manner described, the external lead terminals 14 on the upper level surface portion 12 of the module and the connecting sections 22a of the terminal conductors 22 on the upper face of the adaptor 2 are at the same level or aligned in the same plane. As a result, when a printed circuit board (not shown) is mounted on the power transistor module 1 to provide an electronic device, such as an inverter, all of the terminals of the module are positioned in the same plane, so wiring connections between these terminals and the circuits on the printed circuit board are easily accomplished.

Figure 2:
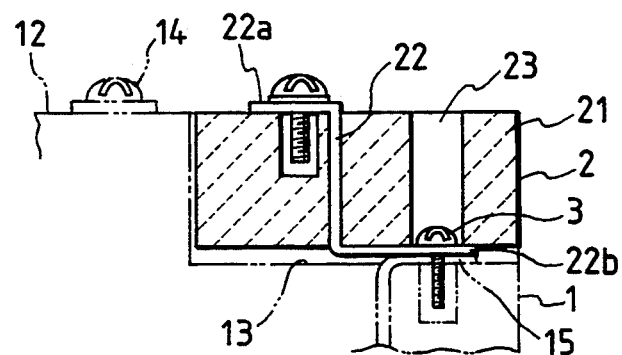
FIG. 2 is an enlarged cross-section of the external lead terminal adaptor shown in FIG. 1.
Figure 3A:
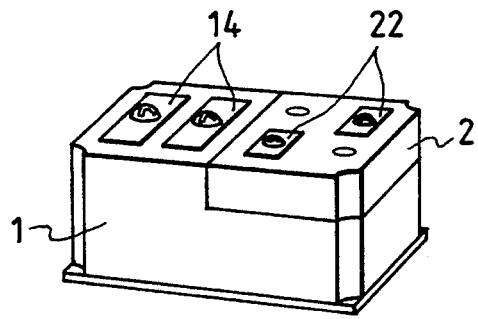
FIG. 3(a) is a perspective view of an assembled power transistor module and an external lead terminal adaptor in which the adaptor shown in FIG. 1 is used.

FIG. 3(a) illustrates the appearance of an assembly of the power transistor module 1 and the external lead terminal adaptor 2 in which the adaptor shown in FIG. 1 is used.

Figure 3B:
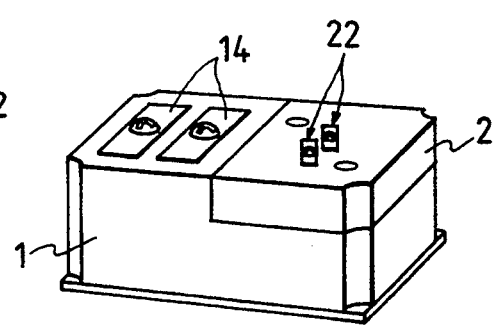
FIG. 3(b) is a perspective view of another embodiment of the adaptor.

FIG. 3(b) is another exemplary embodiment in which self-fastening or snap on terminals are used at the upper ends of the terminal conductors 22 of the adaptor 2. In the case where the external lead terminals 15 disposed on the lower level portion 13 of the power transistor module 1 are similar self fastening terminals, it is contemplated that this type of terminal structure will be accommodated by forming the connecting sections 22b of the terminal conductors 22 disposed on the lower face of the adaptor 2 as mating fasteners such as sockets to cooperate with male fasteners on the module 1.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A combination of an external lead terminal adaptor and a semiconductor device, wherein said external lead terminal adapter comprises:
    a block body formed of resin and having upper and lower end faces; and
    at least one terminal conductor integrally formed embedded in said block body and extending through said block body, said terminal conductor having a connecting section at each end, said connecting sections being disposed on the respective end faces of said block body; and
wherein said semiconductor device comprises:
    a package and a top cover for said package, said cover having a stepped formation to provide an upper level surface portion and a lower level surface portion, at least one external lead terminal being disposed on each of said upper and lower surface portions;
    said external lead terminal adaptor being stacked on said lower level surface portion to compensate the level difference between said upper and lower level surface portions, the connecting section disposed on the lower end face of said block body being electrically connected with the at least one external lead terminal disposed on said lower level surface portion.

2. The combination according to claim 3, wherein said block body has at least one screw insertion hole, the position of said screw insertion hole respectively corresponding to the position of the connecting section disposed on the lower end face of said block body, said screw insertion holes extending from the upper end face of said block body to the connecting section at the lower end face of the block body.

* * * * *